United States Patent
Mansour

(10) Patent No.: US 10,527,663 B2
(45) Date of Patent: Jan. 7, 2020

(54) KALMAN FILTER FOR PHASE NOISE TRACKING

(71) Applicant: Texas Instruments Incorporated, Dallas, TX (US)

(72) Inventor: Mohamed Mansour, Richardson, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 585 days.

(21) Appl. No.: 14/645,681

(22) Filed: Mar. 12, 2015

(65) Prior Publication Data

US 2016/0266186 A1 Sep. 15, 2016

(51) Int. Cl.
*G01R 29/26* (2006.01)
*H04B 17/354* (2015.01)

(52) U.S. Cl.
CPC .......... *G01R 29/26* (2013.01); *H04B 17/354* (2015.01)

(58) Field of Classification Search
None
See application file for complete search history.

(56) References Cited

U.S. PATENT DOCUMENTS

| | | | | |
|---|---|---|---|---|
| 7,618,369 B2* | 11/2009 | Hayter | ............... | A61B 5/14532 600/309 |
| 8,374,668 B1* | 2/2013 | Hayter | ............... | A61B 5/14532 600/347 |
| 2009/0198118 A1* | 8/2009 | Hayter | ............... | A61B 5/14532 600/347 |
| 2012/0179458 A1* | 7/2012 | Oh | ...................... | G10L 21/0208 704/203 |

OTHER PUBLICATIONS

Thomas Neu, Clock jitter analyzed in the time domain, Part 1, Texas Instruments Incorporated, Analog Applications Journal Texas Instruments Incorporated 3Q 2010, www.ti.com/aaj, p. 5-11.*
S.H. Chung in Forward-backward non-linear filtering technique for extracting small biological signals from noise, p. 71-86, 1991, Elsevier Science Publishers B.V. (Year: 1991).*
Welch, Greg; Bishop, Gary; "An Introduction to the Kalman Filter," Department of Computer Science, University of North Carolina at Chapel Hill, Chapel Hill, NC 27599-3175, 16 pages.

* cited by examiner

*Primary Examiner* — Tung S Lau
(74) *Attorney, Agent, or Firm* — Brian D. Graham; Charles A. Brill; Frank D. Cimino

(57) ABSTRACT

A forward-backward Kalman filter for estimating phase noise present in a received signal. Both the forward and backward Kalman filters use hard-decision measurements of the received symbols. The phase noise estimate from the forward Kalman filter is used as a coarse phase noise estimate for the backward Kalman filter and vice versa. The final phase noise estimate is an optimal combination of the forward phase noise estimate and backward phase noise estimate.

13 Claims, 2 Drawing Sheets

KALMAN FILTER FOR PHASE NOISE TRACKING

BACKGROUND

In signal processing, phase noise is the frequency domain representation of rapid, short-term, random fluctuations in the phase of a waveform, caused by time domain instabilities, sometimes referred to as jitter. In certain wireless communication systems, such as backhaul systems that operate at microwave or e-band carrier frequency, the phase noise is a major issue that limits the system performance. Efficient phase noise tracking is crucial for the overall performance of such systems and especially for narrowband systems. Many existing schemes for tracking phase noise employ a simple interpolator—either a linear operator or a digital phase-locked loop—to interpolate between phase pilots. Such a digital phase-locked loop requires extensive tuning for every modulation setting.

SUMMARY

Illustrative embodiments of the present invention are directed to a Kalman filter for estimating phase noise present in a received signal. The Kalman filter includes a state transition module and a measurement module. The state transition module estimates phase noise present in a received signal at a time t based on an estimate of the phase noise present in the received signal at a prior time t−1. The measurement module updates the estimate of the phase noise based on a measurement of the received signal. The operations of the state transition module and the measurement module are illustratively performed iteratively.

DETAILED DESCRIPTION

Figure 1:
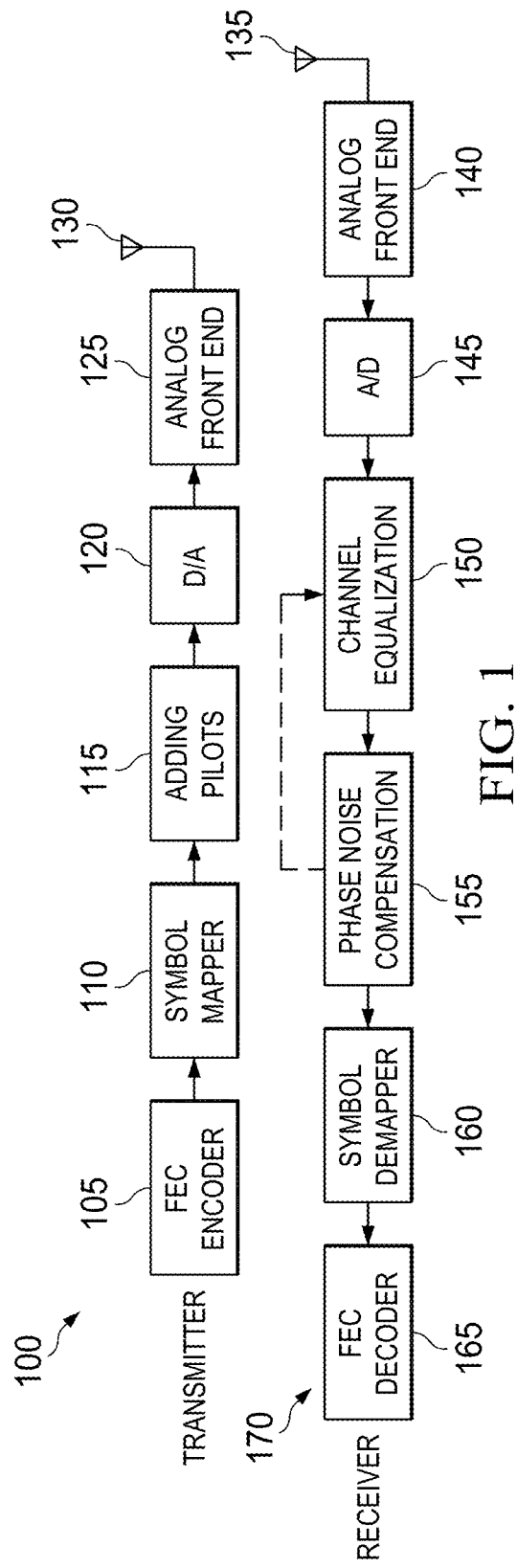
FIG. 1 is a functional block diagram of an illustrative point-to-point communication system.

FIG. 1 is a functional block diagram of an illustrative point-to-point communication system in which the present invention can be employed. FIG. 1 is for illustrative purposes only and should not be construed as limiting in any way. The phase noise tracking functionality of the present invention can be employed in point-to-point communication systems having any number of architectures and configurations. FIG. 1 includes a transmitter 100 that transmits communication signals to a receiver 170. The transmitter 100 includes a forward error correction (FEC) encoder 105, a symbol mapper 110, a module 115 for adding pilot symbols to the transmitted signal, a digital-to-analog converter 120, an analog front end 125, and an antenna 130. FEC encoder 105 encodes digital data using the well-known forward error correction encoding technique. Symbol mapper 110 receives an input bitstream from the FEC encoder 105 and maps it to appropriate constellation points as dictated by a specified modulation method, resulting in a series of symbols to be transmitted. The pilot-adding module 115 inserts known pilot symbols into the symbol stream. These pilot symbols are used by the receiver 170 to assist with phase noise estimation as is described in detail in the present specification. Digital-to-analog converter 120 converts the digital data stream into an analog electrical signal. Analog front end 125 performs a variety of analog signal processing functions to prepare the signal for wireless transmission via the antenna 130.

The antenna 135 of the receiver 170 receives the transmitted signal and provides it to the analog front end 140, which performs a variety of analog signal processing functions on the signal and provides it to the analog-to-digital converter 145, which converts the signal to digital. The channel equalization module 150 receives the digital signal and processes it to reverse the distortion (e.g., intersymbol interference) incurred by the signal during its transmission from the transmitter 100 to the receiver 170. The phase noise compensation module 155 tracks the phase noise present in the received signal and compensates for it in order to allow recovery of the transmitted symbols. In one embodiment, the phase noise compensation module also provides an estimate of the phase noise to the channel equalization module 150, which uses it to improve channel equalization. The symbol demapper 160 performs the inverse operation of the symbol mapper 110 and retrieves the encoded bitstream from the received symbols. The FEC decoder 165 performs the inverse operation of the FEC encoder 105 to retrieve the original digital data.

In an illustrative embodiment, the phase noise compensation module 155 employs Kalman filtering to track the phase noise in the received signal. Kalman filtering is an algorithm that uses a series of measurements observed over time, containing noise (random variations) and other inaccuracies, and produces estimates of unknown variables that tend to be more precise than those based on a single measurement alone. More formally, the Kalman filter operates recursively on streams of noisy input data to produce a statistically optimal estimate of the underlying system state. The Kalman filter is the optimal linear minimum mean-square estimator (MMSE) for sequential estimating of signals in white noise.

The scalar Kalman filter aims at estimating the state of the Kalman filter at each time step using a combination of the estimates from the earlier state and the new measurements. The model of the scalar Kalman filter is composed of two basic relations: the state transition equation and the measurement equation. The state transition equation relates the current state of the Kalman filter to the old state. The measurement equation relates the measurements at time t to the state at the same time. If x(t) is the state at time t, and z(t) is the corresponding measurement, then the model for scalar Kalman filter has the form, $$x(t) = \alpha_t x(t-1) + w_t \qquad \text{(Eq. 1)}$$

$$z(t) = \beta_t x(t) + u_t \qquad \text{(Eq. 2)}$$

Eq. 1 is the state transition equation. $\alpha_t$ represents the state transition model that is applied to the previous state x(t−1). The process noise $w_t$ is zero-mean Gaussian with variance $\sigma_w^2(t)$. Eq. 2 is the measurement equation. $\beta_t$ is a scalar, which maps the true state value into the observed measurement. The measurement noise $u_t$ is zero-mean Gaussian noise with variance $\sigma_u^2(t)$. In an illustrative embodiment, $\sigma_w^2(t)$ is fixed to $\sigma_w^2$. The objective of the Kalman filter is to find the optimal estimate $\hat{x}(t)$ and the corresponding variance $\hat{\sigma}^2(t)$. The standard recursive Kalman equations for computing $\hat{x}(t)$ and $\hat{\sigma}^2(t)$ are $$\hat{x}(t\_) = \alpha_t x(t-1) \quad \text{(Eq. 3)}$$

$$\sigma^2(t\_) = \alpha_t^2 \hat{\sigma}^2(t-1) + \sigma_w^2 \quad \text{(Eq. 4)}$$

$$K(t) = \frac{\sigma^2(t\_)\beta_t}{\sigma^2(t\_)\beta_t^2 + \sigma_v^2(t)} \quad \text{(Eq. 5)}$$

$$\hat{x}(t) = \hat{x}(t\_) + K(t)[z(t) - \beta_t \hat{x}(t\_)] \quad \text{(Eq. 6)}$$

$$\hat{\sigma}^2(t) = \sigma^2(t\_)[1 - K(t)\beta_t] \quad \text{(Eq. 7)}$$

In an illustrative embodiment, $\alpha_t$ is set to 1. Therefore, for every new measurement there are a total of six multiplications and one division. The initial value of $\hat{\sigma}^2(0)$ is set to an arbitrary large value.

If the transmitted and received symbol at time t are $y_t$ and $r_t$ respectively, then the phase noise error model has the form, $$r_t = y_t e^{j\phi_t} + u_t \quad \text{(Eq. 8)}$$

where $u_t$ is the additive white Gaussian noise (AWGN) component, and $\phi_t$ is the phase noise error. The additive white Gaussian noise is a basic noise model used to mimic the effect of many random processes that occur in nature. The AWGN component $u_t$ is a complex Gaussian random variable with zero mean and variance proportional to the signal-to-noise ratio. The phase noise error $\phi_t$, is the error resulting from phase noise, which will also at times be referred to herein as simply "the phase noise." Now, assume we have a known coarse estimate $\bar{\phi}_t$ of the phase noise such that the difference $$\delta_t = \phi_t - \bar{\phi}_t \quad \text{(Eq. 9)}$$

has a relatively small amplitude. Then the phase noise model in (Eq. 8) could be written as $$\tilde{r}(t) = y_t e^{j\delta_t} + \tilde{u}(t) \quad \text{(Eq. 10)}$$

where $\tilde{r}(t) = r(t) \cdot e^{-j\bar{\phi}(t)}$, and $\tilde{u}(t) = u(t) \cdot e^{-j\bar{\phi}(t)}$. Note that $\tilde{u}(t)$ has the same statistical properties as $u(t)$. If $\bar{\phi}_t$ is known, then the objective of phase noise tracking is to estimate $\delta_t$. From (Eq. 10), using Euler expansion we have $$\tilde{r}(t) = y_t \cos(\delta_t) + j\, y_t \sin(\delta_t) + \tilde{u}(t) \quad \text{(Eq. 11)}$$

If $|\delta_t| \ll 1$, then $\cos(\delta_t) \approx 1$, and $\sin(\delta_t) \approx \delta_t$. Hence, (Eq. 11) reduces to $$\hat{r}(t) \approx j y_t \delta_t + \tilde{u}(t) \quad \text{(Eq. 12)}$$

where $$\hat{r}(t) = \tilde{r}(t) - y_t \quad \text{(Eq. 13)}$$

Eq. 12 is the basic measurement equation for Kalman filtering. Note that, in general, $y_t$ is a complex variable. Therefore, Eq. 12 is expressed in two real measurement equations.

The main difficulty with phase noise estimation at the receiver is that the transmitted symbols $\{y_t\}$ which are needed for phase noise estimation are not known at the receiver (except for the inserted pilots). The phase noise estimator has to guess their values prior to estimating the phase noise. For most of the symbols in the received signal, this guess is based on making a hard-decision regarding the received symbols. For a typical system employing forward error correction (FEC), the input symbol error rate is in the range of 0.01-0.1. These frequent errors could significantly impact system performance. To aid the phase noise estimation, in an illustrative embodiment, a known pilot sequence is inserted into the transmitted symbols. The frequency of the pilot signal is a trade-off between the code rate efficiency and the accuracy of phase noise estimation. An illustrative range of pilot overhead is 2-5%. The pilot symbols act as anchors for phase noise estimation because the transmitted signal is known, allowing the receiver to make a better phase noise estimate.

From (Eq. 8), $$e^{j\phi_t} = \frac{1}{y_t}[r(t) + u(t)] \quad \text{(Eq. 14)}$$

i.e., the estimation error is inversely proportional to $|y_t|$. Therefore, in an illustrative embodiment, the pilot sequence is chosen from the maximum amplitude points in the constellation.

The estimate of the phase noise at the pilot symbols is $$\bar{\phi}_t = \arg[r(t)/p_t] \quad \text{(Eq. 15)}$$

This estimate serves as the initial estimate $\bar{\phi}_t$ of the phase noise for the transmitted symbols between two successive pilot symbols. This estimate can be used as is or it can be linearly interpolated.

The Kalman-based phase noise tracking aims at estimating $\delta_t$ at each time unit t based on the value of the received symbols and the earlier estimates $\{\delta_t\}_{t<t'}$. The estimation is run iteratively and the coarse estimate in the first iteration comes from the phase noise estimate of the pilot symbols. Assume we have two pilots at time $\tau$ and $\tau+N_p$, with the corresponding phase noise estimates per Eq. 15 being $\bar{\phi}_\tau$ and $\bar{\phi}_{\tau+N_p}$. For zero-order interpolation, $\bar{\phi}_t = \bar{\phi}_\tau$ for $\tau \le t \le \tau + N_p/2$, and $$\bar{\phi}_t = \bar{\phi}_{\tau+N_p} \text{ for } \tau + \frac{N_p}{2} < t \le \tau + N_p.$$

For the first-order interpolation, $$\bar{\phi}_t = \bar{\phi}_\tau + (t-\tau)\frac{\bar{\phi}_{\tau+N_p} - \bar{\phi}_\tau}{N_p} \text{ for } \tau \le t \le \tau + N_p \quad \text{(Eq. 16)}$$

From Eq. 12, the model for Kalman-based phase noise estimation has the form $$\delta(t) = \delta(t-1) + w_t \quad \text{(Eq. 17)}$$

$$\text{Real}\{\tilde{r}(t)\} = -\text{Imag}\{y_t\}\delta(t) + \tilde{u}_r(t) \quad \text{Eq. 18}$$

$$\text{Imag}\{\tilde{r}(t)\} = \text{Real}\{y_t\}\delta(t) + \tilde{u}_i(t) \quad \text{(Eq. 19)}$$

where $\tilde{u}_r(t)$ and $\tilde{u}_i(t)$ are respectively the real and imaginary parts of $\tilde{u}(t)$. Eq. 17 is the state transition equation, also referred to as the model equation or the process equation. The state transition equation generates an estimate of the phase noise at a time t based on the phase noise estimate at a prior time t−1, and further based on the process noise $w_t$. The state transition equation models the phase noise using small-error approximation. Illustratively, the phase noise estimate at time t is computed as the sum of the phase noise estimate at the prior time t−1 and the process noise $w_t$. The process noise $w_t$ has a variance $\sigma_w^2$ that, in one embodiment, is set to unity. Eqs. 18 and 19 are the two measurement equations for each hard-decoded symbol. The estimate of the transmitted symbol $y_t$ is computed by making a hard decision regarding the received symbols. The measurement equations incorporate a measurement noise factor $\tilde{u}_r(t)$, $\tilde{u}_i(t)$ whose associated variance $\sigma_u^2$ is proportional to the distance between the received symbol and $y_t$. In an illustrative embodiment, up to four measurements are provided to the measurement module, the measurements corresponding to the immediate surrounding constellation symbols of the received symbol. The variance of the real and imaginary part of each measurement is also proportional to the distance. The details of hard symbol decoding are described in more detail below with respect to Eqs. 25-29.

For every hard-decision symbol at time t, there are two measurements to the Kalman filter that correspond to the real and imaginary parts of the hard-decision symbol. These two measurements are used to update the phase noise estimate at time t using standard Kalman update equations eq. (3)-(7). For the second measurement, the model covariance 4 may be set to a smaller value. Similarly, if more than one hard-decision symbol is used to estimate the phase noise at time t, the model variance $\sigma_w^2$ may be set to a smaller value after the first hard-decision symbol. In an alternative embodiment, standard vector Kalman filter equations are used with a measurement constructing a vector of size 2N, where N is the number of hard decision symbols that are used.

Figure 2:
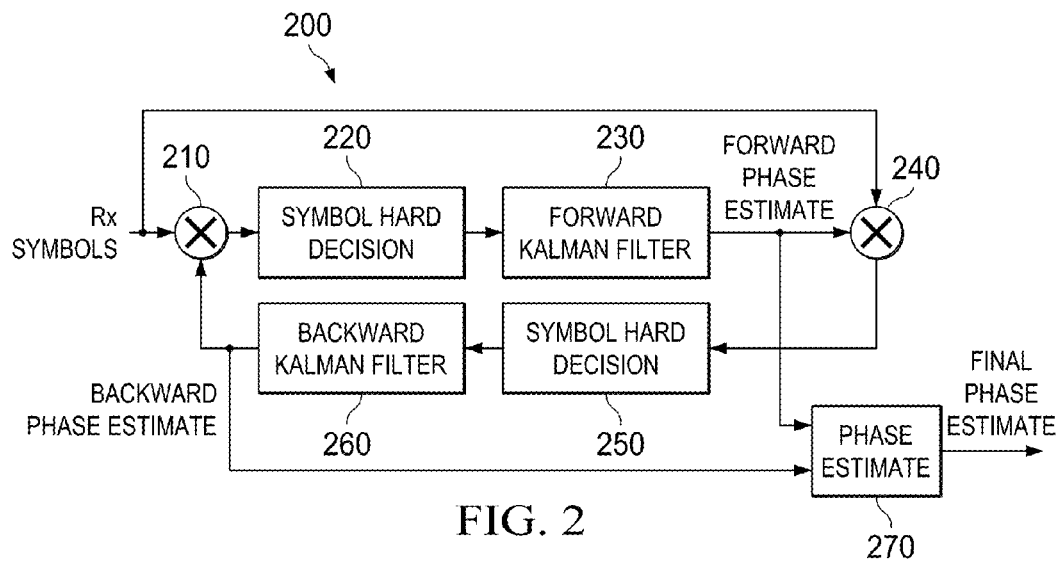
FIG. 2 is a functional block diagram representing a phase noise estimation system including a forward-backward Kalman filter

Note that the Kalman filter is the optimal sequential linear minimum mean-square estimator (LMMSE). In an illustrative embodiment, the performance of the Kalman filter is further improved by introducing extra delay to incorporate future measurements. FIG. 2 is a functional block diagram representing a phase noise estimation system 200 including a forward-backward Kalman filter, which introduces such delay in order to incorporate future measurements. In this implementation, there are two Kalman filters running in sequence. The received signal is mixed with the backward phase estimate produced by the backward Kalman filter 260 and provided to the hard decision decoder 220. The hard decision decoder 220 generates a hard decision regarding the value of the transmitted symbol, as will be described in more detail below with respect to Eqs. 25-29. The hard decision is provided to the forward Kalman filter 230, which corresponds to the Kalman filter described above, with model equations as set forth in Eqs. 17-19. The forward phase estimate generated by the forward Kalman filter 230 is combined with the received signal at mixer 240 and provided to hard decision decoder 250. The hard decision is provided to the backward Kalman filter 260. The backward Kalman filter 260 has measurement equations similar to Eqs. 18 and 19 but it runs in reverse order and the state model becomes $$\delta(t-1) = \delta(t) + w_t',$$ (Eq. 20)

where $w_t' = -w_t$, i.e., it has exactly the same statistics. There are two important advantages of introducing the backward Kalman filter 260. The first is that incorporating future measurements (in both forward and reverse directions) improves the overall estimate. The second is that it provides the required redundancy $\bar{\phi}_t$ for both forward and backward filters. The initial phase estimate $\bar{\phi}_f(t)$ for the forward filter 230 is the output of the backward filter 260 from the earlier iteration, and the initial phase estimate $\bar{\phi}_b(t)$ for the backward filter 260 is the output of the forward filter 230 from the current iteration. Each Kalman iteration includes a full run of the forward filter 230 and a full run of the backward filter 260 with the forward filter running first.

The Kalman configuration runs iteratively until convergence or up to a maximum number of iterations (whichever comes first). In the first iteration, the coarse phase noise estimate $\bar{\phi}_t$ of the forward filter 230 is computed from the raw estimate of the phase noise at the pilot symbols as discussed earlier.

The forward Kalman filter 230 and the backward Kalman filter 260 each have their own estimate $\delta_f(t)$ and $\delta_b(t)$ of the phase correction at time t. The overall phase estimate in the forward direction is $$\hat{\phi}_f(t) = \bar{\phi}_f(t) + \delta_f(t)$$ (Eq. 21)

The overall phase estimate in the backward direction is $$\hat{\phi}_b(t) = \bar{\phi}_b(t) + \delta_b(t)$$ (Eq. 22)

Each estimate comes with the corresponding variance $\hat{\sigma}_f^2(t)$ and $\hat{\sigma}_b^2(t)$ for the forward and backward filters respectively.

The phase noise estimation module 270 calculates a final phase noise estimate based on the forward phase estimate and the backward phase estimate. In one embodiment, the overall phase noise estimate is computed as $$\hat{\phi}(t) = [\hat{\sigma}_b^2(t)\hat{\phi}_f(t) + \hat{\sigma}_f^2(t)\hat{\phi}_b(t)]/[\hat{\sigma}_t^2(t)]$$ (Eq. 23)

and the overall variance is $$\hat{\sigma}^2(t) = \hat{\sigma}_b^2(t)\hat{\sigma}_f^2(t)/[\hat{\sigma}_b^2(t) + \hat{\sigma}_f^2(t)]$$ (Eq. 24)

Note that, $\hat{\sigma}^2(t) \leq \hat{\sigma}_f^2(t)$ and $\hat{\sigma}^2(t) \leq \hat{\sigma}_b^2(t)$. The symbol hard decision is not run for pilot symbols because they are known. The corresponding measurement variance for pilot symbols is set to minimum.

Note that while FIG. 2 shows two different functional blocks 220 and 250 representing hard decision decoding, in one embodiment the functions of these two blocks may be performed by a single block of code. The objective of the symbol hard-decision decoding is to find the value of transmitted symbol $y_t$ that is used in the Kalman measurement equations (Eq. 18) and (Eq. 19). To increase the estimation reliability, in certain embodiments, the hard decision decoder provides a few (four in one illustrative embodiment) of the immediate neighboring symbols of the received symbols to the corresponding Kalman filter (230 or 260), rather than providing only the closest one.

In the presence of phase noise, the distance between the received symbols and each of the constellation symbols will include the error component due to the phase noise. As mentioned previously, we have an initial rough estimate of the phase noise (from the estimate of the phase noise at the pilot symbols). The phase noise estimation is thus reduced to estimating the displacement $S_t$ from the initial estimate.

Starting from the error model of Eq. 12, assume u(t) is a zero-mean complex Gaussian random variable with variance $\sigma^2$, and the phase noise estimate has variance $\varepsilon^2$. Then the variances of the overall error in the real and imaginary components are respectively $$\sigma_I^2 = \sigma^2/2 + \varepsilon^2 |Im\{y_t\}|^2$$ (Eq. 25)

$$\sigma_Q^2 = \sigma^2/2 + \varepsilon^2 |Re\{y_t\}|^2$$ (Eq. 26)

These variances are used to define the measurement variance to the Kalman filter for the real and imaginary components of the hard-decision symbol (respectively).

For a given symbol $y_t$. The phase noise variance $\pounds^2$ is obtained from the corresponding estimate variance of the Kalman filter. For example, in the forward Kalman filter, we use the phase noise variance at each time from the phase noise estimate of the backward filter for the same time, and vice versa. The maximum likelihood estimate of $y_t$ is $$\hat{y}_t = \arg\max p(y_t|\tilde{r}(t))$$ (Eq. 27)

Letting $p(\tilde{r}(t)|y_t)$ denote the probability of observing $\tilde{r}(t)$ in Eq. 12 given $y_t$ is transmitted, $$p(\tilde{r}(t)|y_t) = \int_{\delta_t} p(t(\delta_t|y_t) \quad \text{(Eq. 28)}$$

and $$p(\tilde{r}(t)|y_t) = \int_{\delta_t} p(t), \delta_t|y_t( \quad \text{(Eq. 29)}$$

In one embodiment, the denominator $p(\tilde{r}(t))$ is ignored as it does not contribute to the maximization in Eq. 27. In Eq. 29, WO is zero-mean Gaussian with variance $\varepsilon^2$, and $p(\tilde{r}(t)|y_t, \delta_t)$ is complex Gaussian with variance $\sigma^2$. Therefore, in an illustrative embodiment, the integral in Eq. 28 is computed for all the immediate neighbors of the modified received symbol $\tilde{r}(t)$ to find the probability that each symbol is transmitted. In certain embodiments, this is done numerically using a coarse approximation of the integration in Eq. 28. These probabilities are normalized to sum to unity. Hence, the output of the symbol hard-decision module 220, 250 is the nearest symbols $\{y_t\}$ and an estimate of the corresponding probability $p(y_t|\tilde{r}(t))$.

The input parameters to the Kalman filter measurement equations that constitute the measurement module are the real and imaginary parts of the constellation symbol(s) in addition to the corresponding measurement variances. In an illustrative embodiment, the variance of each measurement is inversely proportional to the corresponding probability from the hard-decision module 220, 250. Let $y_t^{(k)}$ denote the $k^{th}$ symbol from the hard-decision module 220, 250 with the corresponding probability being $P_k$ (where $\Sigma_k P_k = 1$). Define $\eta_k = P_k/(1-P_k)$. In one embodiment, in order to prevent excessive values of $\eta_k$, it is constrained by clipping its value so that it stays in the range [0.01, 20]. The variances of the real and imaginary measurement components (respectively) become $$\sigma_r^2(t,k) = \sigma_u^2 \cdot A/\eta_k + B\varepsilon^2 |Im\{y_t\}|^2 \quad \text{(Eq. 30)}$$

$$\sigma_I^2(t,k) = \sigma_u^2 \cdot A/\eta_k + B\varepsilon^2 |Re\{y_t\}|^2 \quad \text{(Eq. 31)}$$

where A and B are scaling factors that are tuned for the best performance. The scaling factor A is a function of the model variance and the bandwidth. In an illustrative embodiment, the model variance in (Eq. 1) is fixed to $\sigma_w^2 = 1$, and the corresponding scale factor is computed as $$A = 2 \times 10^{-6} \times B/7 \quad \text{(Eq. 32)}$$

where B is the bandwidth in MHz. Note that, at each time step there are up to four symbols each for the real and imaginary parts. Therefore, in this embodiment there are a maximum of eight measurements per time step.

For the pilot symbols, the hard decision does not need to be run since the values of the pilot symbols are known. Therefore, the corresponding $\eta_k$ is set to the maximum possible value ($\eta_k = 20$, in this illustrative embodiment). Thus, the pilot symbols are handled in exactly the same way as other symbols except for setting the variance to the minimum possible value.

Figure 3:
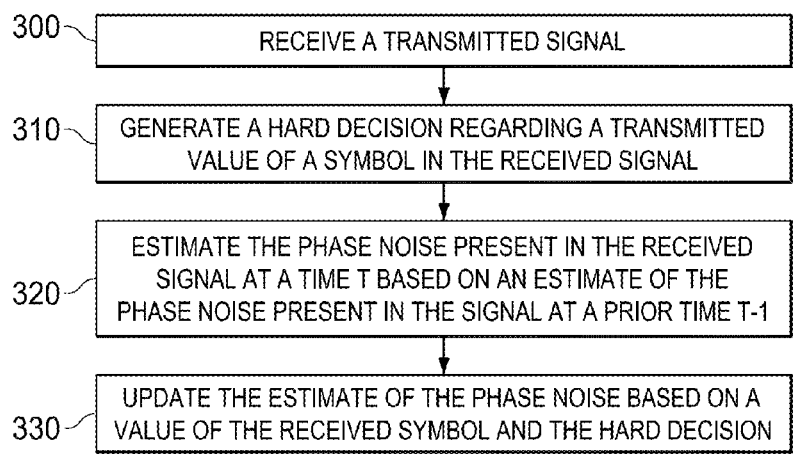
FIG. 3 is a flowchart representing an illustrative method of estimating the phase noise present in a received signal.

FIG. 3 is a flowchart representing an illustrative method of estimating the phase noise present in a received signal using the forward Kalman filter. At step 300, a transmitted signal is received. At step 310, a hard decision regarding a transmitted value of a symbol in the received signal is generated. In an illustrative embodiment, the hard decision is generated as described above with respect to, e.g., Eqs. 25-29. At step 320, the phase noise present in the received signal at a time t is estimated based on an estimate of the phase noise present in the received signal at a prior time t−1. In an illustrative embodiment, the phase noise is estimated according to Eq. 17. At step 330, the estimate of the phase noise is updated based on a value of the received symbol and the hard decision. In an illustrative embodiment, the phase noise is updated according to Eqs. 18 and 19.

Having thus described circuits and methods for estimating phase noise via Kalman filtering by reference to certain of their preferred embodiments, it is noted that the embodiments disclosed are illustrative rather than limiting in nature and that a wide range of variations, modifications, changes, and substitutions are contemplated in the foregoing disclosure. Furthermore, in some instances, some features of the present invention may be employed without a corresponding use of the other features. Accordingly, it is appropriate that the appended claims be construed broadly and in a manner consistent with the broad inventive concepts disclosed herein.

What is claimed is:

1. A method, comprising:
   receiving, with a receiver, a signal;
   applying a backward phase noise correction estimate to the signal to produce a first intermediate signal;
   generating, with the receiver, a first decision regarding a transmitted value of a symbol in the first intermediate signal, wherein the first decision has a first variance between the transmitted value and the first intermediate signal;
   generating, with the receiver, a first forward phase noise correction estimate for the signal at a time t based on a second forward phase noise correction estimate for the signal at a prior time t−1 and the first variance; and
   updating, with the receiver, the backward phase noise correction estimate based on the first forward phase noise correction estimate, and the first decision regarding the transmitted value of the symbol to reduce the first variance.

2. The method of claim 1, further comprising:
   determining a first phase noise estimate of phase noise present in the received signal at the time t; and
   determining a second phase noise estimate of the phase noise present in the received signal at the prior time t−1,
   wherein the first forward phase noise correction estimate is an estimate of a difference between the first phase noise estimate and the actual phase noise present in the received signal at the time t, and
   wherein the second forward phase noise correction estimate is an estimate of a difference between the second phase noise estimate and the actual phase noise present in the received signal at the prior time t−1.

3. The method of claim 1, wherein generating the decision includes:
   determining distances from the symbol to a plurality of constellation points; and
   generating the decision based on the distances and an estimate of the phase noise.

4. The method of claim 1, wherein:
   the updating of the backward phase noise correction estimate includes:
      applying the first forward phase noise correction estimate to the signal to produce a second intermediate signal; and
      generating, with the receiver, a second decision regarding a transmitted value of a symbol in the second intermediate signal;
   the second decision has a second variance; and
   the backward phase noise correction estimate is updated further based on the second variance.

5. The method of claim 1, wherein the backward phase noise correction estimate is a first backward phase noise correction estimate and is based on a second backward phase noise correction estimate for the signal at the prior time t−1.

6. The method of claim 1, wherein the generating of the first forward phase noise correction estimate includes applying a Kalman filter.

7. The method of claim 1, wherein the updating of the backward phase noise correction estimate includes applying a backward Kalman filter.

8. The method of claim 2, further comprising:
determining the first phase noise estimate based on one or more pilot symbol values.

9. The method of claim 3, wherein generating the decision includes generating variance values of the first variance corresponding to the constellation points, and wherein generating the backward phase noise correction estimate includes generating the backward phase noise correction estimate based on the first forward phase noise correction estimate, the received value of the symbol, the constellation points, and the variance values.

10. The method of claim 4 further comprising determining a final phase noise correction estimate based on the first forward phase noise correction estimate and the backward phase noise correction estimate.

11. The method of claim 10, wherein the final phase noise correction estimate is further based on the first variance and the second variance.

12. The method of claim 10, wherein the determining of the final phase noise correction estimate is performed in response to convergence of the first forward phase noise correction estimate and the backward phase noise correction estimate.

13. The method of claim 10, wherein the determining of the final phase noise correction estimate is performed in response to a count of iterations of: the applying of the backward phase noise correction estimate, the generating of the first decision, the generating of the first forward phase noise correction estimate, and the updating of the backward phase noise correction estimate.

* * * * *